United States Patent [19]

Barbara

[11] 3,965,460

[45] June 22, 1976

[54] MOS SPEED-UP CIRCUIT

[75] Inventor: Bruce J. Barbara, Tempe, Ariz.

[73] Assignee: Motorola, Inc., Chicago, Ill.

[22] Filed: Jan. 2, 1975

[21] Appl. No.: 537,992

[52] U.S. Cl. ............................ 340/173 R; 307/205; 340/173 CA

[51] Int. Cl.² .................... G11C 7/00; G11C 11/24

[58] Field of Search.... 340/173 R, 173 FF, 173 CA; 307/214, 215, 218, 238, 205

[56] References Cited
UNITED STATES PATENTS

| | | | |
|---|---|---|---|
| 3,765,002 | 10/1973 | Basse............................ | 340/173 CA |
| 3,774,176 | 11/1973 | Stein et al..................... | 340/173 CA |

Primary Examiner—Stuart N. Hecker
Attorney, Agent, or Firm—Harry M. Weiss; Charles R. Hoffman

[57] ABSTRACT

A speed-up circuit, which may be used to speed up the sensing of a bit-sense line of an MOS RAM, includes a crosscoupled latch circuit having an output suitable for coupling to an output circuit for the RAM. A plurality of bit-sense lines of the RAM storage array are coupled to load circuitry for one side of the latch circuit. When partial discharging of a bit-sense line by a selected memory cell occurs, the latch circuit switches state and provides feedback internal to the latch circuit and other feedback external to the latch circuit to aid the selected memory storage cell in discharging a bit-sense line much more rapidly than could have been achieved by the action of the selected storage cell alone, and also assures complete discharging of the bit-sense line, which avoids destroying stored data in the selected memory cell during a refresh cycle. The external feedback is coupled to discharge devices connected to the various bit-sense lines serving various sections of the memory array.

15 Claims, 2 Drawing Figures

MOS SPEED-UP CIRCUIT

RELATED INVENTIONS

The MOS speed-up circuit of this invention is related to copending patent application BIT SENSE LINE SPEED-UP CIRCUIT FOR MOS RAM, Serial No. 475,560, filed June 3, 1974, now U.S. Pat. No. 3,942,160 by Robert T. Yu and assigned to the assignee of the present invention.

BACKGROUND OF THE INVENTION

MOS dynamic random access memories (RAMs) have provided the lowest cost semiconductor storage memory yet achievable. Recent research in the area of MOS dynamic RAMs has led to steadily increasing storage cell density and faster access times. However, as the density of storage cells of an MOS array has increased, the size of the individual cells has become progressively smaller and the current discharging capability of individual storage cells with respect to discharging the bit-sense line capacitance has decreased. Efforts have been made to decrease the access times of dynamic MOS memories by providing circuits which sense relatively small voltage changes of the bit-sense lines. Another approach to decreasing access times has been to couple bit-sense lines to circuits which sense the initial discharge of the bit-sense line by a selected storage cell and in response to cut in and aid the selected storage cell in further discharging the bit-sense line. In the abovementioned co-pending patent application a speed-up circuit which accomplishes this function is described. The memory storage array is broken up into sections, each of which shares, an associated bit-sense line. Each bit-sense line is coupled to a speed-up circuit which includes a latch circuit. The output of each speed-up circuit is connected to the same data output circuit.

SUMMARY OF THE INVENTION

It is an object of the invention to provide an improved circuit for speeding up the discharge of a bit-sense line of a random access memory.

It is an object of the invention to provide an MOS speed-up circuit which speeds voltage transitions at a plurality of inputs thereto.

It is an object of the invention to provide an MOS speed-up circuit which provides improved power dissipation, requires fewer components, and results in lower cost than previously available speed-up circuits.

Briefly described, the invention provides a speed-up circuit which includes a latch circuit having two output nodes which are cross coupled to opposite input switching devices. One side of the latch includes load circuitry which includes logic circuitry which performs a logical function on a plurality of inputs, at least one of which is to be speeded up by the action of the speed-up circuit. In one embodiment, feedback is provided externally from the latch to the inputs of transistors which act to speed-up the inputs in response to a change in the output voltage of the latch circuit. This assures a complete discharge of the selected input.

DESCRIPTION OF THE INVENTION

Figure 1:
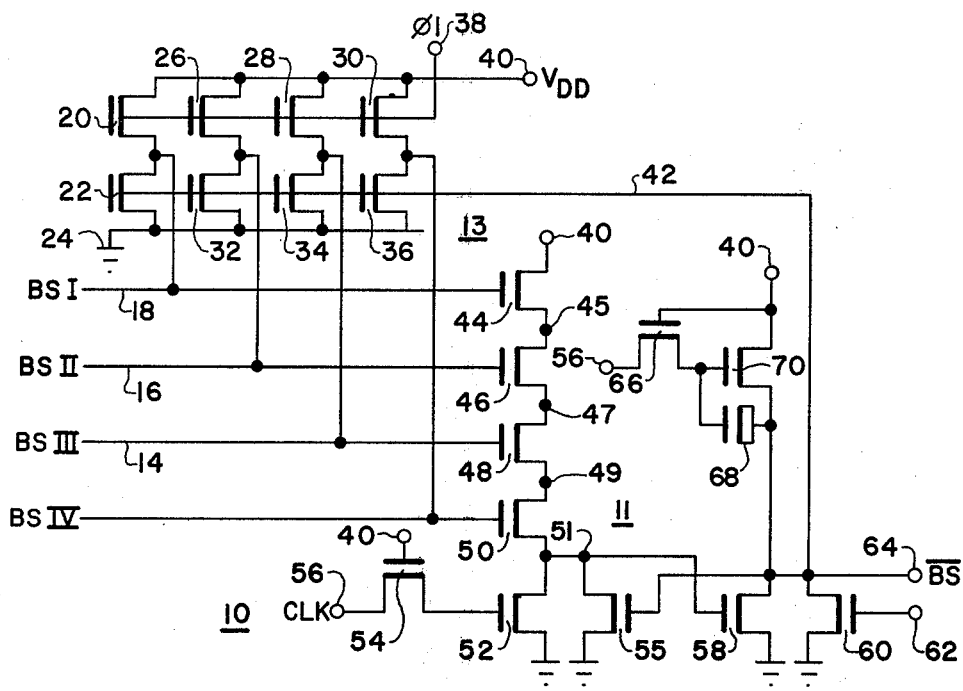
FIG. 1 is a schematic drawing of a presently preferred embodiment of the invention.

Referring to FIG. 1, circuit 10 includes speed-up circuit 11 and precharge and discharge circuitry 13. Circuitry 13 includes MOSFETs (metal oxide semiconductor field effect transistor) 20, 26, 28, and 30 each having a drain electrode connected to $V_{DD}$ voltage conductor 40, and each also having a gate electrode connected to $\phi 1$ conductor 38. MOSFETs 20, 26, 28, and 30 are precharge devices, as explained in the referenced co-pending patent application, and have their source electrodes connected, respectively, to bit sense lines BSI, BSII, BSIII, and BSIV, respectively. Circuitry 13 also includes feedback discharge MOSFETs 22, 32, 34, and 36 each having its source connected to ground voltage conductor 24 and each having a gate electrode connected to feedback conductor 42. MOSFETs 22, 32, 34, and 36 have their drain electrodes connected, respectively, to BSI, BSII, BSIII, BSIV.

Speed-up circuit 11 includes a latch circuit which includes two cross coupled inverting stages, the first inverting stage including MOSFETs 44, 46, 48, 50, 52, 54 and 55. The second inverting stage includes MOSFETs 66 and 70, 58, and 60 and capacitor 68.

MOSFET 44 is coupled between $V_{DD}$ conductor 40 and node 45 and has its gate electrode connected to BSI conductor 18. MOSFET 46 is connected between nodes 45 and 47 and has its gate electrode connected to BSII conductor 16. MOSFET 48 is connected between nodes 47 and 49 and has its gate electrode connected to BSIII conductor 14. MOSFET 50 is connected between node 49 and node 51 and has its gate electrode connected to BSIV conductor 12. MOSFETs 52 and 55 are connected in parallel between nodes 51 and ground node 24. MOSFET 52 has its gate electrode connected to the drain of MOSFET 54, which has its source connected to conductor 56 and has its gate electrode connected to $V_{DD}$ conductor 40. MOSFET 55 has its gate electrode connected to node 64, which is the output of speed-up circuit 11, and generates a signal designated $\overline{BS}$ which is connected to output circuit, not shown.

MOSFET 66 is connected between CLK conductor 56 and a gate electrode of MOSFET 70. The gate electrode of MOSFET 66 is connected to $V_{DD}$ voltage conductor 40. MOSFET 70 is connected between $V_{DD}$ conductor 40 and output node 64. Enhanced capacitor 68 is connected between the gate of MOSFET 70 and node 64. MOSFETs 58 and 60 are connected in parallel between nodes 64 and ground node 24. The gate electrode of MOSFET 58 is connected to node 51, which is the output of the first inverting stage, and the gate electrode of MOSFET 60 is connected to set input 62 generated by circuitry not shown in the drawing.

Figure 2:
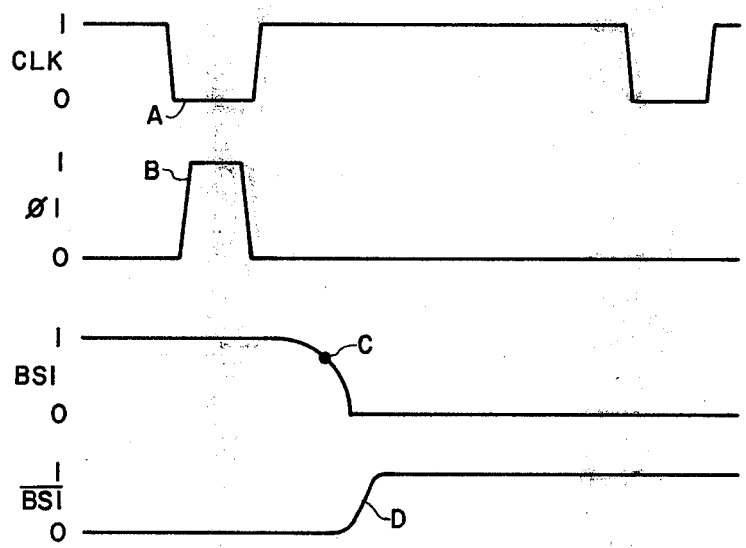
FIG. 2 is a timing diagram useful in describing the operation of the circuit of FIG. 1.

The operation of the circuitry in FIG. 1 is described with reference to the timing diagram of FIG. 2 which includes a CLK wave-form applied to node 56, the $\phi 1$ waveform applied to node 38, and BSI, a signal which may appear on node 18. The purpose of the speed-up circuitry 11 is to hasten the discharge of BSI by a selected memory cell (not shown). FIG. 2 also includes waveform $\overline{BS}$ generated by circuit 11 at node 64.

Initially $\phi 1$ goes positive, during pulse B. This turns MOSFETs 20, 26, 28 and 30 on, which precharges BSI, BSII, BSIII, and BSIV, respectively, to approximately $V_{DD}-V_T$ volts, assuming the magnitude of $\phi 1$ is $V_{DD}$ volts. Meanwhile, CLK has gone negative to a logical 0 during pulse A, turning off MOSFET 52. During $\phi 1$ pulse B, a set pulse is applied to node 62, turning on MOSFET 60, which insures that node 64 is at ground, so that MOSFET 55 is also off. Thus, MOSFET's 44, 46, 48, and 50 are all on. As a result, the voltage at node 51 is at approximately $V_{DD}-2V_T$ volts, where $V_T$ is the threshold voltage of the series coupled MOSFET's 44, 46, 48, and 50. (Those skilled in the art may recognize that the sources and drains of MOSFET's as used in integrated circuits are interchangeable, since the MOSFET is a bilateral device. For further discussion of theory and operation of MOSFETs, see *Physics and Technology of Semiconductor Devices*, pages 263–333, by A. S. Grove, John Wiley & Sons, Inc., 1967.)

Since during pulse A, CLK is at a logical 0, the gate of MOSFET 70 is also at a logical 0 and MOSFET 70 is therefore off. Since both MOSFETs 52 and 70 are off when CLK is at a logical 0, there is no DC current path between ground and $V_{DD}$ during that time. At the end of pulses A and B, when CLK has returned to a logical 1 and $\phi1$ has returned to a logical 0, it is assumed that through the action of circuitry not shown a slow initial discharge of BSI occurs. For example, see the following U.S. Pat. Nos. 3,506,851 by Polkinghorn et al, 3,629,618 by Fujimoto, and 3,774,055 by Bapat. In one embodiment of the invention, a selected memory cell causes a discharge of BSI. For a more complete discussion of how and why this occurs, see the above mentioned copending patent application.

It should be noted that the description of the operation herein assumes that all of the MOSFETs are n-channel; however, if the polarity of the waveforms were reversed, and p-channel devices are used instead, the description is still applicable.

After the trailing edge of CLK pulse A, MOSFET 52 is turned on. The combination of MOSFETs 44, 46, 48, 50, and 52 form a source follower voltage divider circuit. The voltage at node 51 follows the initial discharge of BSI at a voltage less in magnitude than the voltage of BSI by an amount equal to the threshold voltage of MOSFET 44 plus an additional amount determined by the geometry ratios of MOSFETs 44, 46, 48, 50 and 52. The geometry ratios of MOSFETs 70 and 58 are selected so that the gain of the inverter formed by MOSFETs 58 and 70 is quite high. Thus, when the voltage at node 51 approaches the threshold of the inverter formed by MOSFETs 58 and 70, the voltage at node 64 ($\overline{BS}$) increases rapidly. This occurs at point C on the BSI waveform of FIG. 2. The current flowing from node 51 to ground conductor 24 through MOSFET 55 rapidly aids, or speeds up, the discharge of node 51 from point C to a logical 0. The action of the bootstrap and load circuitry including MOSFETs 70 and 66 and enhanced capacitor 68 is well known to those skilled in the art and will not be described further herein.

As the voltage $\overline{BS}$ increases, feedback through conductor 42 is applied to the gates of MOSFETS 22, 32, 34, and 36, turning them on. (Note that when $\phi1$ pulse B is ended, MOSFETs 20, 26, 28, and 30 are all off.) BSI, BSII, BSIII, and BSIV are thus rapidly discharged to ground in response to the waveform $\overline{BS}$. This insures that the selected memory cell, (not shown) coupled to BSI has the proper voltage level coupled to its storage node during a subsequent $\phi3$ clock phase. See the above named copending patent application for a more complete description of how and why the voltage on BSI is coupled to the storage node of the selected memory cell.

It should be noted that the provision of the source follower voltage divider circuit is a key aspect of the invention. If the MOSFET geometry ratios are properly chosen, the voltage at which point C of the BSI waveform occurs can be very precisely selected and is relatively independent of MOS processing parameters, especially the MOS threshold voltage. The particular geometry ratios chosen will, of course, depend upon the type of MOS manufacturing process utilized, and the threshold voltages of the MOSFET devices used in the desired latch circuit. Ordinarily, the geometry ratios of MOSFETs 44, 46, 48, 50 and 52 would be chosen such that the impedance of MOSFET 52 is relatively large compared to the total series impedance of MOSFETs 44, 46, 48 and 50. The previously available speedup circuits utilized a simple latch circuit, the switching point of which was heavily dependent on the MOS threshold voltage, and which further was adjustable only by adjusting the gain of one of the inverting stages forming the latch circuit. This could only be accomplished at the expense of great sacrifices in speed, power, and sensitivity to MOS processing parameters. Further, a separate previously available speed-up circuit was required for each of the inputs BSI-BSIV, and four outputs such as $\overline{BS}$ were required to be coupled to the output circuit (not shown). This resulted in a much more complex output circuit being required which in turn required more chip area, more MOSFETs, and consequently higher cost and lower yield.

It should be recognized that the speedup circuit according to the invention has broad applicability in its basic concept of providing a combinational logic function source follower voltage divider circuit as one half of a latch circuit which senses an initial discharge and rapidly changes state in response thereto. The combinational logic portion may, for example, be a logical OR function or any combination of MOSFETs which allows node 51 to follow an input to the combinational logic portion.

It should be noted that several terms commonly used in the art are utilized in this specification including the "access time" of a "ramdom access memory". A random access memory is one that is addressable on the basis of the configuration of a plurality of binary inputs; the access time is the amount of time required to obtain information from the addressed memory cell. A "latch circuit" is one that is capable of storing or latching a logic state and is usually basically a flip-flop comprising cross coupled logic gates or inverters. The term inverting circuit may refer either to an inverter or to a NOR or NAND gate or to an inverting combinational gate. A combinational logic gate is one that forms a logical function on a plurality of inputs, but which is catagorized as any of the conventional gates such as AND gates, OR gates, NAND gates, NOR gates, etc. A load device or load circuit as used herein, is a device or circuit which may often be referred to as a pull-up device or circuit and is coupled between a voltage conductor and an output of a logic gate, the voltage at the voltage conductor being approximately equal to a logical 1 for the circuit. Similarly, a switching device or switching circuit is one often referred to as a pull-down circuit or a device and is coupled between an output of a logic gate and another voltage conductor which has applied thereto a voltage approximately equal to a voltage of a logical 0 for the the circuit. A source follower circuit or source follower device is one which includes a MOSFET having its gate electrode connected to an input and provides an output which is connected to, or coupled to, a source of the MOSFET, which is also coupled to a pull-down circuit. The output of the source follower circuit follows the input at a voltage reduced in magnitude from the voltage applied to the input by an amount equal to the threshold voltage of the MOSFET plus an amount determined by the current flowing through the pull-down MOSFET and the geometry ratio of said MOSFET.

While the invention has been described in relation to a particular embodiment thereof, those skilled in the art will recognize that variations in arrangement and placement of parts may be made to suit varying requirements within the scope of the invention.

What is claimed is:

1. A speed-up circuit comprising first circuit means coupled, respectively, to a plurality of inputs for sensing a beginning of a voltage transition on one of said inputs and generating a feedback signal, each of said inputs being electrically isolated from the others of said inputs; and second circuit means said first circuit means responsive to said feedback signal coupled to said plurality of inputs for speeding up a remaining portion of said transition.

2. A speed-up circuit for speeding up the access time of a MOS random access memory including first feedback means internal to said speed-up circuit coupled between an output and an input of said speed-up circuit and second feedback means coupled between said output of said speed-up circuit and a gate of a discharge MOSFET, said discharge MOSFET being coupled between a bit-sense conductor and a voltage conductor, said discharge MOSFET being exclusive of said first feedback means.

3. An MOS speed-up circuit for a random access memory comprising:

latching transistor circuit means having a plurality of inputs for sensing the beginning of a voltage transition at one of said inputs, each of said inputs coupled, respectively, to a bit-sense conductor of said random access memory; and discharge circuit means exclusive of said latching transistor circuit means coupled to said plurality of inputs and responsive to an output of said latching transistor circuit means for aiding part of a transition of voltage at one of said inputs detected by said latching transistor circuit means.

4. The speed-up circuit as recited in claim 3 wherein said latching transistor circuit means includes combinational gate means having logic circuit pull-up means coupled to said bit-sense conductors and logic circuits pull-down means coupled to clocked biasing means.

5. The speed-up circuit as recited in claim 4 wherein said logic circuit pull-up means forms an AND logic function.

6. The speed-up circuit as recited in claim 4 wherein said logic circuit pull-up means performs an OR logic function.

7. The speed-up circuit as recited in claim 6 wherein said pull-up means includes a plurality of MOSFETs coupled between a first voltage conductor and a first internal node and said pull-down means includes a first MOSFET coupled between said first internal node and a second voltage conductor and further includes a second MOSFET coupled between said first internal node and said second voltage conductor and having a gate electrode connected to an output of said latching transistor circuit means.

8. The speed-up circuit as recited in claim 7 wherein said first MOSFET, when in the "on" condition, has a substantially higher impedance than the series combination of said plurality of MOSFETs.

9. The speed-up circuit as recited in claim 8 wherein said clock biasing means includes a third MOSFET coupled between said gate of said first MOSFET and a clock conductor.

10. The speed-up circuit as recited in claim 9 further including an MOS NOR gate having first and second switching MOSFETs coupled, respectively, between said output and said second voltage conductor, said output being connected to said gate of said second MOSFET, said first internal node being connected to a gate electrode of said first switching MOSFET, said second switching MOSFET having a gate electrode connected to a set input conductor, said NOR gate having clocked bootstrap circuit load means coupled between said first voltage conductor and said output clocked by a signal applied to said clock conductor.

11. A latching circuit comprising:

at least one input;

combinational logic circuit pull-up means coupled to said input for providing an output voltage which follows the voltage applied to said input;

pull-down means coupled to said pull-up means for controlling a voltage drop between said voltage applied to said input and said output voltage; and inverting circuit means having an input to which said output voltage is applied and an output coupled to said pull-down means for maintaining a stored logic state in said inverting circuit means.

12. A latching circuit comprising inverting circuit means including an output and further including at least one input and further including first source follower means coupled to said output and having an input thereof coupled to an input of said inverting circuit means for controlling a voltage which, when applied to an input of said source follower means, causes switching of said inverting circuit means, changing the stored state in said latching circuit.

13. The latching circuit as recited in claim 12 wherein said source follower means includes a pull-up MOSFET having a gate electrode coupled to one of said inputs of said source follower means and a pull-down MOSFET having a drain coupled to an output of said source follower means and a source coupled to a voltage conductor 14. The latching circuit as recited in claim 12 wherein said source follower means includes four MOSFETs coupled in series between a first voltage conductor and an output of said source follower means, each of said MOSFETS having a gate electrode coupled, respectively, to corresponding inputs of said source follower means, and two MOSFETs coupled in parallel between said output of said source follower means and a second voltage conductor, one of said parallel MOSFETs having its gate electrode coupled to said output of said inverting circuit means and its drain connected to said input of said inverting circuit means.

15. A MOSFET speed-up circuit for dynamic random access memory comprising:

four bit-sense inputs;

a four-input AND gate including first, second, third, and fourth MOSFETs coupled in series between a first voltage conductor and an output of said AND gate each having, respectively, a gate electrode coupled to one of said bit-sense inputs and fifth and sixth MOSFETs coupled in parallel between said output of said AND gate and a second voltage conductor;

a two input NOR gate having one input connected to said output of said AND gate and having an output connected to a gate electrode of said sixth MOSFET;

seventh, eighth, ninth, and tenth MOSFETs coupled between said first voltage conductor and between, respectively, said bit-sense inputs and each having a gate electrode connected to a clock conductor;

eleventh, twelfth, thirteenth, fourteenth MOSFETs coupled between said second voltage conductor and said bit-sense inputs, respectively, and each having its gate electrode coupled to said output of said two-input NOR gate.

* * * * *

UNITED STATES PATENT AND TRADEMARK OFFICE
CERTIFICATE OF CORRECTION

PATENT NO. : 3,965,460
DATED : June 22, 1976
INVENTOR(S) : Bruce J. Barbara

It is certified that error appears in the above-identified patent and that said Letters Patent are hereby corrected as shown below:

Change Column 5, line 23 to read "second circuit means respon-"

Signed and Sealed this

Eleventh Day of April 1978

[SEAL]

Attest:

RUTH C. MASON
Attesting Officer

LUTRELLE F. PARKER
Acting Commissioner of Patents and Trademarks